(12) United States Patent
Burroughes et al.

(10) Patent No.: US 8,013,328 B2
(45) Date of Patent: Sep. 6, 2011

(54) ACTIVE MATRIX OPTICAL DEVICE

(75) Inventors: Jeremy Burroughes, Cambridge (GB); Mark Bale, Wells (GB); Mark Garbett, Warboys (GB); Jonathan Halls, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 12/529,295

(22) PCT Filed: Apr. 3, 2008

(86) PCT No.: PCT/GB2008/001190
§ 371 (c)(1),
(2), (4) Date: Oct. 26, 2009

(87) PCT Pub. No.: WO2008/122780
PCT Pub. Date: Oct. 16, 2008

(65) Prior Publication Data
US 2010/0102300 A1     Apr. 29, 2010

(30) Foreign Application Priority Data

Apr. 4, 2007   (GB) .................................. 0706654.1

(51) Int. Cl.
*H01L 29/08*   (2006.01)

(52) U.S. Cl. ................................ 257/40; 257/79; 257/88
(58) Field of Classification Search ................... 257/40, 257/79, 88
See application file for complete search history.

(56) References Cited

U.S. PATENT DOCUMENTS

| 6,150,668 | A | 11/2000 | Bao et al. |
| 2004/0041146 | A1 | 3/2004 | Cheng et al. |
| 2006/0220544 | A1 | 10/2006 | Okuyama et al. |
| 2007/0012916 | A1 | 1/2007 | Choi et al. |
| 2007/0023837 | A1 | 2/2007 | Lee et al. |

OTHER PUBLICATIONS

International Preliminary Report on Patentability for Application No. PCT/GB2008/001190, dated Oct. 6, 2009.
International Search Report for PCT/GB2008/001190 dated Oct. 7, 2008.

*Primary Examiner* — Long Pham
(74) *Attorney, Agent, or Firm* — Marshall, Gerstein & Borun LLP

(57) ABSTRACT

An active matrix organic optical device comprising a plurality of organic thin film transistors and a plurality of pixels disposed on a common substrate, wherein a common bank layer is provided for the organic thin film transistors and the pixels, the common bank layer defining a plurality of wells, wherein some of the wells contain the organic semiconducting material of the organic thin film transistors therein and others of the wells contain organic optically active material of the pixels therein.

15 Claims, 5 Drawing Sheets

ACTIVE MATRIX OPTICAL DEVICE

FIELD OF INVENTION

The present invention relates to an active matrix optical device. Embodiments of the invention relate to methods of depositing organic thin film transistors and optically active pixels on a common substrate in order to form an active matrix optical device, in particular an active matrix organic light emitting device.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and injecting holes or electrodes.

For example, a p-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an n-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance.

Transistors can be formed by depositing the components in thin films to form a thin film transistor (TFT). When an organic material is used as the semi-conductive material in such a device, it is known as an organic thin film transistor (OTFT). OTFTs may be manufactured by low cost, low temperature methods such as solution processing. Moreover, OTFTs are compatible with flexible plastic substrates, offering the prospect of large-scale manufacture of OTFTs on flexible substrates in a roll-to-roll process.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulating material disposed between the gate electrode and the semi-conductive material in the channel region.

One use of transistors is in active matrix optical devices such as light-detecting and light emitting devices, in particular organic light-emissive devices and organic photodetector arrays. For example, an active matrix organic light-emissive display comprises a matrix of organic light-emissive devices forming the pixels of the display. Each organic light emissive device comprises an anode, a cathode, and an organic light-emissive layer disposed therebetween. In operation, holes are injected into the device through the anode and electrons are injected into the device through the cathode. The holes and electrons combine in the organic light-emissive layer to form an exciton which then undergoes radiative decay to give light (in light detecting devices this process essentially runs in reverse). Other layers may also be provided between the electrodes in order to enhance charge injection and transport such as a hole injecting layer, an electron injecting layer, a hole transporting layer, and/or an electron transporting layer. Blends of materials can also be used in order to enhance operation, such as a blend of charge transporting and emissive material. An organic photoresponsive device comprises the same structure of an organic layer located between two electrodes, and can in fact be regarded as an organic light-emitting device operating in reverse (i.e. holes and electrons are generated and separated upon exposure of the device to light).

The pixels of an active matrix organic light-emissive display can be switched between emitting and non-emitting states by altering the current flow through them using a memory element typically comprising a storage capacitor and two transistors, one of which is a driving transistor.

Use of a common substrate for thin film transistors and organic light-emissive devices in order to form an active matrix organic light-emissive display is known. For example, U.S. Pat. No. 6,150,668 discloses depositing organic thin film transistors (OTFTs) and organic light-emissive devices (OLEDs) on a common substrate and using the same layer of material for both the OTFT gate and the OLED anode. The OLED cathode is selectively deposited through a shadow mask. Furthermore, U.S. Pat. No. 6,924,503 discloses depositing oTFTs and OLEDs on a common substrate and using the same layer of material for the source and drain of the OTFT and the anode of the OLED. This document also discloses formation of a top-gate of the OTFT and cathode of the OLED in one step by depositing a metal over the whole surface and then patterning the layer to form the top gate and the cathode.

In light of the above, it is evident that in the prior art monolithic OLED/OTFT constructions, some of the layers in the OLED and OTFT must be selectively deposited and patterned by post-deposition treatment. For example, separate structures are provided for containing the organic semi-conductive material of the OTFT and the organic light-emissive material of the OLED. Furthermore, in the prior art arrangements, the cathode of the OLED and the gate of the OTFT have either been selectively deposited or patterned by post-deposition treatment in order to prevent electrical shorts between the OTFT and OLED on a top side of the device.

It is an aim of certain embodiments of the present invention to provide methods of manufacturing active matrix organic light-emissive displays comprising thin film transistors and organic light-emissive devices deposited on a common substrate which are easier and quicker than prior art arrangements thus saving time and cost in the display manufacturing process.

It is further aim of certain embodiments of the present invention to reduce processing steps involved in such methods and produce new structures for active matrix organic light-emissive displays comprising thin film transistors and organic light-emissive devices deposited on a common substrate.

It is a further aim of certain embodiments of the present invention to provide alternative methods and structures for isolating thin film transistors and organic light-emissive devices deposited on a common substrate in an active matrix organic light-emissive display to prevent electrical shorts between the thin film transistors and organic light-emissive devices.

It is a further aim of certain embodiments of the present invention to provide alternative methods and structures for encapsulating thin film transistors which are deposited on a common substrate with organic light-emissive devices in an active matrix organic light-emissive display.

SUMMARY OF THE INVENTION

An active matrix organic optical device comprising a plurality of organic thin film transistors and a plurality of pixels disposed on a common substrate, wherein a common bank layer is provided for the organic thin film transistors and the pixels, the common bank layer defining a plurality of wells, wherein some of the wells contain the organic semiconducting material of the organic thin film transistors therein and others of the wells contain organic optically active material of the pixels therein.

The optical device may be an organic light-responsive device (e.g. a photodetector) or an organic light-emitting device (e.g. an organic light-emitting display). Preferably, the device is an organic light emitting device in which case the organic optically active material is an organic light emitting material.

A pixel circuit is formed by each pixel and its associated organic thin film transistor, together with any additional drive elements. For example, each pixel circuit in an active matrix organic light-emitting device will typically comprise the light-emitting pixel diode; the associated organic thin film transistor serving as a drive transistor; a switching thin film transistor; and a capacitor.

According to a second aspect of the present invention there is provided a method of manufacturing an active matrix organic optical device comprising formation of a plurality of organic thin film transistors and a plurality of pixels on a common substrate, wherein a common bank layer is provided for the organic thin film transistors and the pixels, the common bank layer defining a plurality of wells, some of the wells containing the organic semiconductive material of the organic thin film transistors therein and others of the wells containing organic optically active material of the pixels therein.

According to the first and second aspects of the invention, a common bank structure is provided for both the organic semiconductive material of the organic thin film transistors and the organic optically active material of the pixels in an active matrix organic optical device. The common bank structure provides a quick and easy method for isolating the OTFT and pixel structures when deposited on a common substrate.

According to a third aspect of the present invention, there is provided a method of forming an active matrix organic optical device comprising: depositing a plurality of thin film transistors and a plurality of organic optically active pixels on a common substrate wherein insulative separator structures are provided to electrically isolate the thin film transistors from the organic optically active pixels on a top side of the active matrix organic optical device.

According to a fourth aspect of the present invention, there is provided an active matrix organic optical device comprising: a plurality of thin film transistors and a plurality of organic optically active pixels on a common substrate wherein insulative separator structures are provided to electrically isolate the thin film transistors from the organic optically active pixels on a top side of the active matrix organic optical device.

According to the third and fourth aspects of the present invention, insulative separator structures are provided to electrically isolate the thin film transistors from the pixels on a top side of the organic optical device. With such an arrangement, the top electrode material of at least one of the pixels and the thin film transistors does not need to be selectively deposited or patterned by post-deposition treatment as in prior art arrangements. The insulative separator structures are provided prior to deposition of the top-electrode layer in order to achieve this.

In one arrangement the insulative separator structures are provided as raised rings around the thin film transistors such that top-electrode material(s) of the thin film transistors is electrically isolated from top-electrode material(s) of the pixels. The rings may be formed by photolithography, and may have an under-cut structure (that is, the thickness of the ring wall is widest at or near its upper surface).

The top electrodes may be formed from one or more layers—for example the top electrode of the pixels may be a cathode comprising a single layer of aluminium or a bilayer of barium and aluminium. In the case of an organic light-emitting device, the top electrode of the organic light-emissive pixels is preferably the cathode, however it may be the anode for a so-called "upside-down" device wherein the pixels are built in the order of cathode—organic light emissive material—anode.

In another arrangement, the insulative separator structures comprise a layer of insulating material over the thin film transistors to electrically isolate the thin film transistors from the top electrode material(s) of the pixels.

In yet another arrangement, a combination of insulative ring separator structures around the thin film transistors and a layer of insulating material over the thin film transistors are provided.

The insulative separator structures may be provided in addition to the common bank structure described in relation to the first and second aspects of the present invention. For example, raised ring structures can be provided on top of the bank structure around the thin film transistors.

The top electrode of both the thin film transistors and the pixels may be formed by depositing a common material such that separate deposition and patterning of top electrodes for the thin film transistors and the organic light emissive pixels can be avoided. The top electrode material can be blanket deposited over the whole active area of the display with the insulative separator structures electrically isolating the top electrodes of the thin film transistors and the organic light emissive pixels as described in relation to the third and fourth aspects of the invention. That is, the top electrodes of the thin film transistors and the organic light-emissive pixels can be formed in a single deposition step.

BRIEF DESCRIPTION OF THE DRAWINGS

The present invention will now be described in further detail, by way of example only, with reference to the accompanying drawings in which.

DETAILED DESCRIPTION OF PREFERRED EMBODIMENTS

Figure 1:
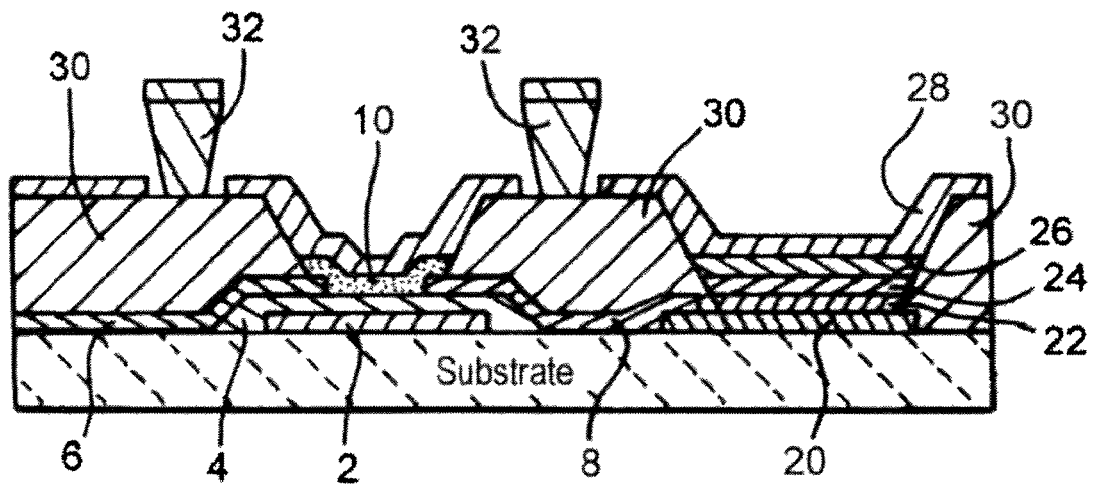
FIG. 1 shows a portion of an active matrix organic light-emissive display according to an embodiment of the present invention.

FIG. 1 shows a portion of an active matrix organic light emissive display according to an embodiment of the present invention. The figure illustrates an organic light-emissive device (OLED) deposited on the right hand side of a substrate and an organic thin film transistor (OTFT) deposited on the left hand side of the substrate for driving the OLED.

The OTFT is of the bottom-gate type and comprises: a gate 2; a gate dielectric layer 4; source and drain electrodes 6, 8; and a layer of organic semi-conductive material 10.

The OLED comprises: an anode 20; a hole injecting layer 22; a hole transporting layer 24; an organic light-emissive layer 26; and a cathode 28.

A common bank structure 30 provides wells into which at least some of the layers of the OLED and OTFT are deposited.

A separator ring 32 is provided on top of the bank structure 30 around the OTFTs. The separator rings 32 isolate the OTFTs from the OLEDs such that the cathode material of the OLEDs can be blanket deposited over the active region of the display without shorting the OLEDs and the OTFTs across the top of the device. That is, the separator rings separate the cathode material deposited over the OLEDs from the cathode material deposited over the OTFTs. The separator rings advantageously have an under-cut structure to enhance electrical isolation of the OLEDs and OTFTs.

The aforementioned arrangement is advantageous as, for an active matrix organic light-emissive display, the cathode for the OLEDs (which may be PLEDs (polymer light-emissive devices) or a SMOLEDs (small molecule organic light-emissive devices)) is generally deposited over the entire active surface of the display. This is because, for an active matrix OLED display, each OLED sub-pixel has a common cathode connection and is selected by control of the anode connection.

One issue with a bottom-emitting active matrix OLED display is that the OTFTs and OLEDs are deposited side by side on the same substrate. For a bottom gate display, the organic semiconductor of the OTFT is exposed on the surface and will make contact with the cathode. By using the technique disclosed herein, a cathode separator ring around the OTFT electrically isolates the cathode metal covering the OTFT from the cathode of the OLED. At the same time, the metal that covers the OTFT serves as a primary encapsulant.

As an alternative to the aforementioned cathode separator ring structure, a layer of insulating material can be provided over the OTFTs prior to deposition of the cathode material of the OLEDs. Protection/passivation of the OTFT from the cathode using such an insulating layer may be required to prevent shorting of the cathode to the source and drain electrodes in the case of exposed metal regions resulting from incomplete organic semi-conductor coverage, and to prevent shorting channel effects. This may be achieved by depositing an organic insulating film on top of the OTFT prior to cathode deposition.

Figure 2:
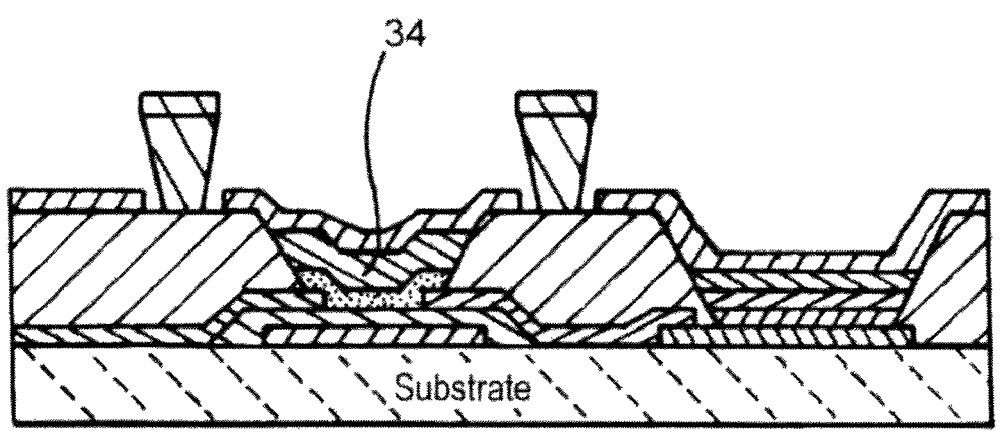
FIG. 2 shows a portion of an active matrix organic light-emissive display according to another embodiment of the present invention.

In one arrangement, illustrated in FIG. 2, the two alternatives discussed above are combined. That is, both ring separators and an insulating layer 34 (an organic passivation material) are provided to further protect and isolate the OTFT from the electrical, physical, and chemical properties of the cathode. For example, if organic semiconductive material is deposited from solution then effects associated with solvent evaporation may cause the resultant film 10 to be thinner at its periphery than in its centre. In this case, the insulating layer 34 serves to prevent the layer of cathode material overlying the organic thin film transistor from contacting the source and/or drain electrodes 6,8. Apart from the addition of an insulating layer over the organic semi-conductive material in the TFT, the other elements in FIG. 2 are the same as those illustrated in FIG. 1 and so have not been re-labelled for clarity.

A preferred approach here would be to deposit the passivation material for the insulating layer 34 by ink jet printing on top of the organic semi-conductive material. Such an ink-jettable passivation material is preferably organic. In order to prevent re-dissolution of the organic semi-conductive material by the passivation ink one of two approaches may be utilized: (1) cross linking of the organic semi-conductive material to allow a wide range of passivation solvents to be used; or (2) ink jet printing from an orthogonal solvent. Having regard to the later approach, organic semi-conductive materials generally are soluble in non-polar solvents while passivation materials are generally soluble in polar solvents (methanol, ethanol, water, PGMEA (Propylene Glycol Methyl Ether Acetate)). Typical materials for use as an organic passivation material include PVA (Polyvinyl Acetate), PMMA (Polymethylmethacrylate) and PVP (Polyvinylphenol).

Figure 3:
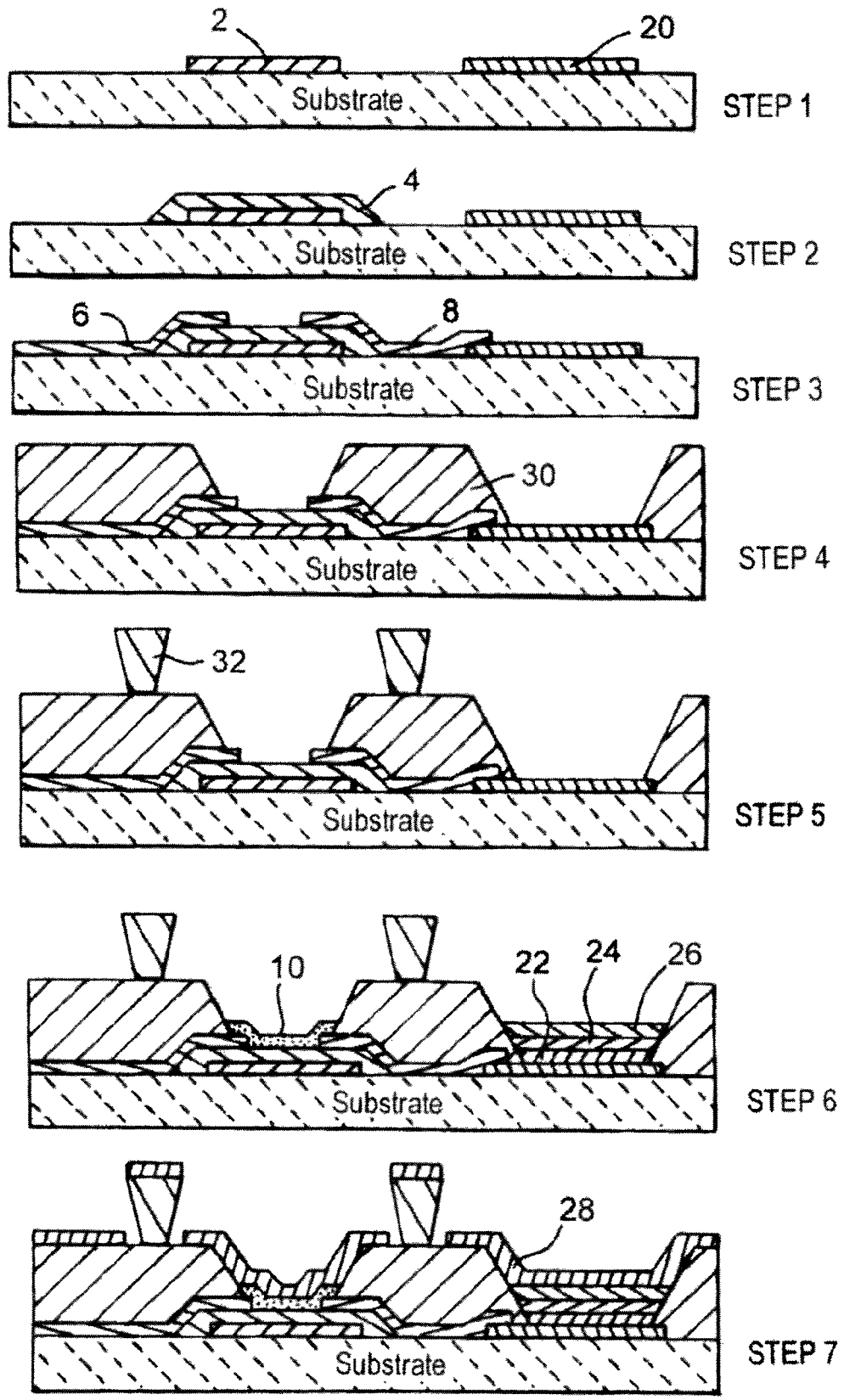
FIG. 3 illustrates the steps involved in forming an active matrix organic light-emissive display according to the embodiment illustrated in FIG. 1.

One way of implementing this invention in an OTFT-PLED display is shown in FIG. 3. The backplane is built up in the following steps (schematic cross sections are shown):

1. Gate 2 and PLED anode 20 deposition and patterning. (e.g. patterning of an ITO-coated substrate);
2. Dielectric deposition and patterning 4 (e.g. cross-linkable, photopatternable dielectrics);
3. Source-drain material deposition and patterning 6, 8 (e.g. gold, photolithography);
4. Bank deposition and patterning 30;
5. Cathode separator deposition and patterning 32;
6. Organic layer deposition, e.g. by ink jet printing (OTFT: organic semiconductor 10; OLED: hole injecting layer 22, hole transport layer 24, light-emissive polymer 26); and
7. Cathode deposition 28.

The organic layers of FIG. 3 are entirely contained within the wells. Although this is preferable, it will be appreciated that it is not critical. For example, light-emissive polymer may be deposited in such a way that layer 26 extends beyond the perimeter of the well but the emission area of the pixel will still be defined by the boundary of the well. Similarly, other layers of a pixel may extend beyond the boundaries of the well (indeed, this is preferred for the cathode of a light-emissive pixel) but the light-emitting or light-detecting area of the pixels will still be defined by the well boundary.

The cathode separators break electrical continuity between the cathode metal covering the OTFTs and the area of metal that covers the OLEDs.

Figure 4:
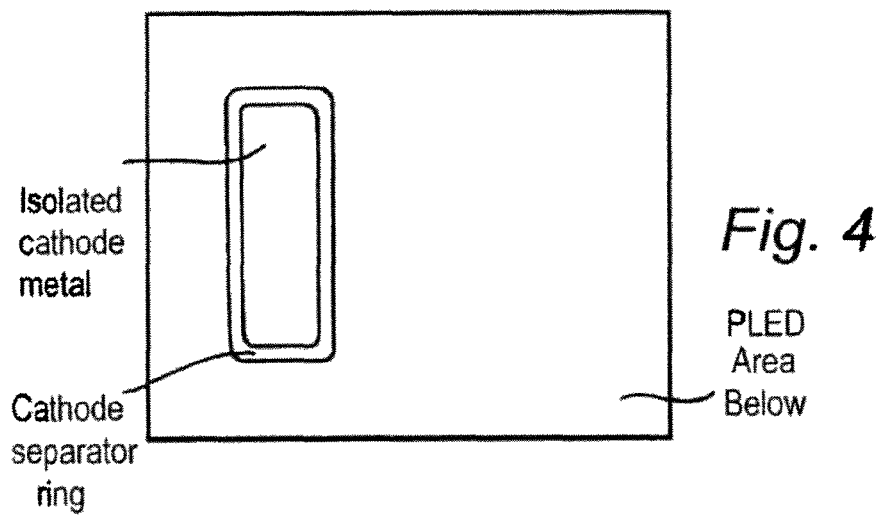
FIG. 4 shows a plan view illustrating separation of an organic thin film transistor and an organic light-emissive device according to an embodiment of the present invention.

FIG. 4 shows a plan view illustrating separation of an organic thin film transistor and an organic light-emissive device. The plan view shows that the separators (illustrated in cross-section in the previously discussed figures) are in fact ring shaped in order to provide isolation of the metal that covers the OTFT. The cathode separator ring surrounds the area in which the organic semiconductive material 10 of the OTFT is located. The organic semiconductive material in the embodiment of FIG. 4 is contained in two wells; the material in these two wells together form part of a single OTFT. Use of a plurality of wells as shown in FIG. 4 is advantageous in that the well dimensions may be selected to ensure good well filling upon printing of the organic semiconductive material into the well, however it does result in an increase in the area of the OTFT due to the inactive areas of bank materials between the wells, which in turn reduces the percentage area of the substrate that can be used for the emitter pixels. Therefore, in an alternative arrangement the organic semiconductive material is contained in a single, large well in order to minimise the area of the OTFT.

Figure 5:
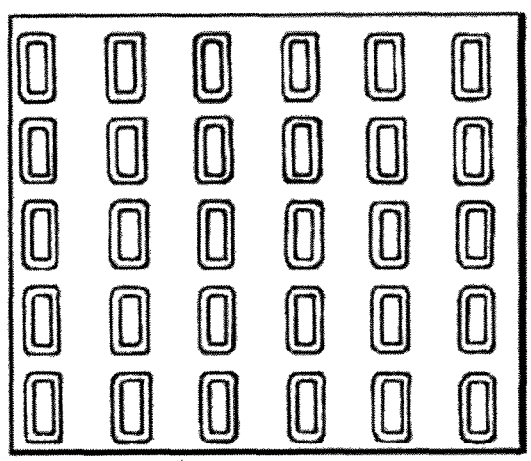
FIG. 5 shows a plan view illustrating an active matrix organic light-emissive display comprising a plurality of electrode separator structures of the type illustrated in FIG. 4.

FIG. 5 shows a plan view illustrating an active matrix organic light-emissive display comprising a plurality of electrode separator structures of the type illustrated in FIG. 4. As only a discrete area of the cathode is "cut out" from the cathode plane, electrical continuity across the panel is maintained.

Figure 6:
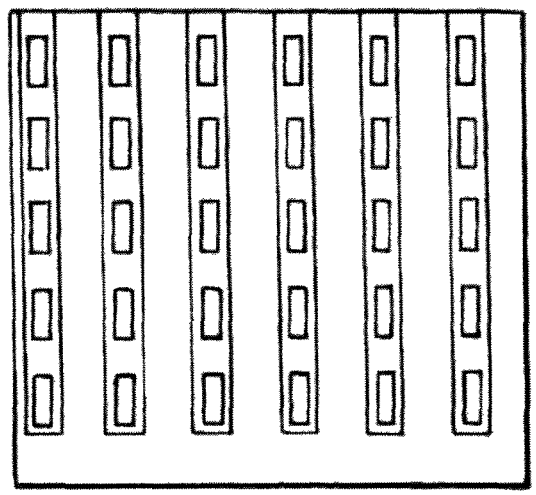
FIG. 6 shows a plan view illustrating an active matrix organic light-emissive display comprising a plurality of electrode separator structures according to another embodiment.

FIG. 6 shows a plan view illustrating an active matrix organic light-emissive display comprising a plurality of electrode separator structures according to another embodiment. In this arrangement, the cathode separator rings have been merged into lines across the display. Such an arrangement separates the cathode into columns, as in a passive matrix display. In this case the lines will need to be connected at the display edges. In FIG. 6, it can be seen that the cathode columns are connected along a bottom region of the display as illustrated in order to form a common cathode across the display.

Figure 7:
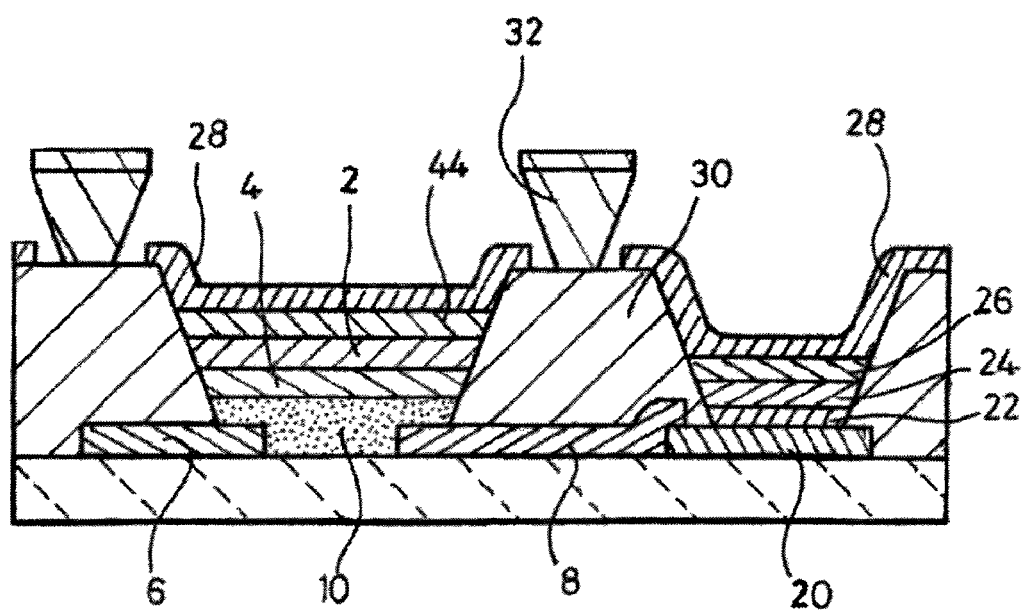
FIG. 7 shows a portion of an active matrix organic light-emissive display according to another embodiment of the present invention comprising a top-gate thin film transistor.

FIG. 7 shows another embodiment comprising a top-gate thin film transistor. The same reference numerals have been used for like parts as in the bottom-gate TFT illustrated in FIG. 1. In the top-gate arrangement, the OLED has the same structure as that illustrated in FIG. 1 but the structure of the TFT is effectively reversed such that the source and drain 6, 8 are deposited on the substrate. A common bank structure 30 is deposited to form wells and the organic semi-conductive material 10 is deposited in the well over the source and drain. The gate dielectric 4 and the gate electrode 2 are subsequently deposited to complete the TFT.

In the embodiment illustrated in FIG. 7, a layer of insulating material 44 is deposited over the gate electrode 2 in order to insulate the gate electrode 2 from the overlying cathode material 28 of the OLED. The insulating material 44 may be the same material as that used for the organic passivation layer 34 in FIG. 2. Alternatively, a different material may be selected as the gate dielectric and gate electrode provide some protection for the underlying organic semi-conductive material in this arrangement and, as a result, a wider range of materials may be selected for layer 44 than for layer 34 in FIG. 2.

Figure 8:
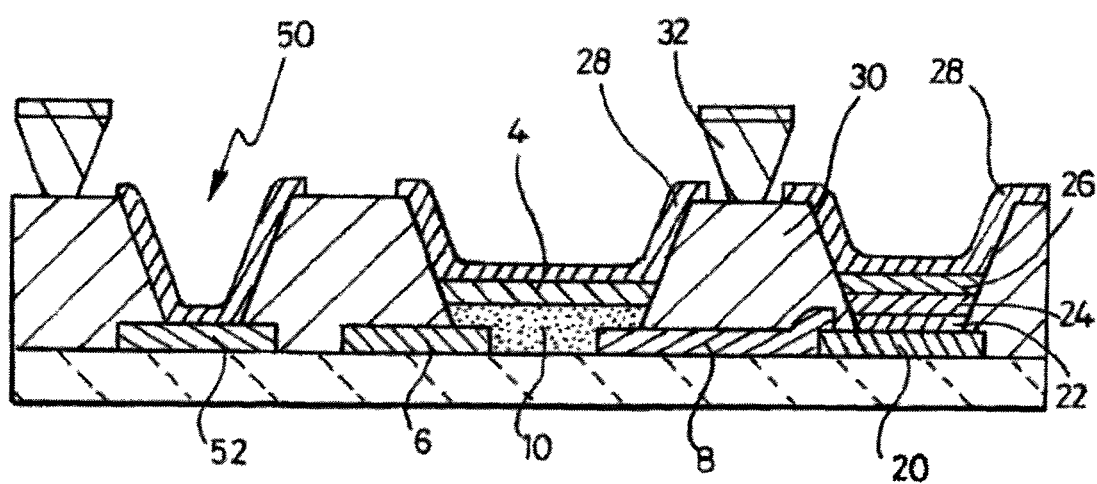
FIG. 8 shows a portion of an active matrix organic light-emissive display according to another embodiment of the present invention comprising a common cathode and gate with a via connecting the gate.

FIG. 8 shows another embodiment comprising common cathode and gate material 28. In this arrangement, no insulating layer is required as the cathode material 28 of the OLED also functions as the gate electrode of the TFT. Again, common reference numerals have been used as in previously discussed figures for common parts.

In the arrangement shown in FIG. 8, an additional via contact 50 is shown for connecting the gate electrode to a conductive connector line 52.

Embodiments of the present invention may thus comprise top-gate or bottom-gate thin film transistors. The top electrode material may be deposited over the whole active area of the display with insulative separator structures preventing shorts between the TFTs and OLEDS. Embodiments of the invention allow a bottom-emission active matrix display to be fabricated with a common, self-masked, cathode that covers the whole display surface. The separated cathode provides primary encapsulation for the OTFT structure. The use of an organic passivation material in conjunction with the cathode separator further improves isolation of the OTFT from the cathode and suppresses short circuit effects. The use of a common bank structure allows for easy fabrication of both TFTs and OLEDs on a common substrate.

Further details of suitable materials and processes for manufacture of devices according to the invention are set out below:

Substrate

The substrate may be rigid or flexible. Rigid substrates may be selected from glass or silicon and flexible substrates may comprise thin glass or plastics such as poly(ethylene terephthalate) (PET), poly(ethylene-naphthalate) PEN, polycarbonate and polyimide.

The organic semiconductive material may be made solution processable through the use of a suitable solvent. Exemplary solvents include mono- or poly-alkylbenzenes such as toluene and xylene; tetralin; and chloroform. Preferred solution deposition techniques include spin coating and ink jet printing. Other solution deposition techniques include dip-coating, roll printing and screen printing.

Organic Semiconductor Materials

Preferred organic semiconductor materials include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

Source and Drain Electrodes

For a p-channel OTFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques discussed above.

For an n-channel OTFT, preferably the source and drain electrodes comprise a material, for example a metal having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The source and drain electrodes are preferably formed from the same material for ease of manufacture. However, it will be appreciated that the source and drain electrodes may be formed of different materials for optimisation of charge injection and extraction respectively.

The length of the channel defined between the source and drain electrodes may be up to 500 microns, but preferably the length is less than 200 microns, more preferably less than 100 microns, most preferably less than 20 microns.

Gate Electrode

The gate electrode 4 can be selected from a wide range of conducting materials for example a metal (e.g. gold) or metal compound (e.g. indium tin oxide). Alternatively, conductive polymers may be deposited as the gate electrode 4. Such conductive polymers may be deposited from solution using, for example, spin coating or ink jet printing techniques and other solution deposition techniques discussed above Thicknesses of the gate electrode, source and drain electrodes may be in the region of 5-200 nm, although typically 50 nm as measured by Atomic Force Microscopy (AFM), for example.

Insulating Layer

The insulating layer comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current $I_D$ is directly proportional to the capacitance. Thus, in order to achieve high drain currents with low operational voltages, OTFTs with thin dielectric layers in the channel region are preferred.

The dielectric material may be organic or inorganic. Preferred inorganic materials include SiO2, $SiN_x$ and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer; and crosslinking of the underlying layer.

The thickness of the insulating layer is preferably less than 2 micrometers, more preferably less than 500 nm.

Further Layers

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, e.g. octadecyltrichlorosilane.

While this invention has been particularly shown and described with reference to preferred embodiments thereof, it will be understood by those skilled in the art that various changes in form and detail may be made therein without departing from the scope of the invention as defined by the appended claims.

The invention claimed is:

1. An active matrix organic optical device comprising a plurality of organic thin film transistors comprising organic semi-conductive material and a plurality of pixels comprising organic optically active material disposed on a common substrate, wherein a common bank layer is provided for the organic thin film transistors and the pixels, the common bank layer defining a plurality of wells, wherein some of the wells contain the organic semi-conductive material of the organic thin film transistors therein and others of the wells contain the organic optically active material of the pixels therein, and wherein a top electrode layer is disposed over the entire active surface of the active matrix organic optical device and insulative separator structures are provided to electrically isolate the thin film transistors from the pixels on atop side of the active matrix organic optical device.

2. An active matrix organic optical device according to claim 1, wherein an electrode layer is disposed on the common substrate, the common bank layer is disposed over the electrode layer, and organic semi-conductive material of the organic thin film transistors and the organic optically active material of the pixels are disposed within the wells of the common bank layer.

3. An active matrix organic optical device according to claim 2, wherein the organic thin film transistors are bottom-gate thin film transistors.

4. An active matrix organic optical device according to claim 3, wherein the electrode layer comprises a gate electrode of each organic thin film transistor, each organic thin film transistor comprising a gate dielectric layer disposed over the gate electrode, and source and drain electrodes disposed over the gate dielectric layer, wherein the common bank layer is disposed over the source and drain electrodes, and the organic semi-conductive material is disposed in a channel region between the source and drain electrodes.

5. An active matrix organic optical device according to claim 2, Wherein the organic thin film transistors are top-gate thin film transistors.

6. An active matrix organic optical device according to claim 5, wherein the electrode layer comprises a source and a drain electrode of each organic thin film transistor, the common bank layer is disposed over the source and drain electrodes, and each organic thin film transistor comprises organic semi-conductive material disposed in a channel region between the source and drain electrodes, a gate dielectric layer disposed over the organic semi-conductive material, and a gate electrode disposed over the gate dielectric layer.

7. An active matrix organic optical device according to claim 1, further comprising an insulating layer disposed over each thin film transistor.

8. An active matrix organic optical device according to claim 1, wherein the insulative separator structures are provided as raised insulative separator rings on the bank layer around the thin film transistors.

9. An active matrix organic optical device according to claim 8, wherein the raised rings have an under-cut wall structure.

10. An active matrix organic optical device according to claim 1, wherein the top electrode layer forms both a top electrode of each organic thin film transistor and a top electrode of each pixel.

11. A method of manufacturing an active matrix organic optical device comprising forming a plurality of organic thin film transistors comprising, organic semi-conductive material and a plurality of pixels comprising organic optically active material on a common substrate, wherein a common bank layer is provided for the organic thin film transistors and the pixels, the common bank layer defining a plurality of wells, wherein some of the wells contain organic semi-conductive material of the organic thin film transistors therein and others of the wells contain the organic optically active material of the pixels therein, forming insulative separator structures on top of the bank layer; and depositing a top electrode layer over the entire active surface of the active matrix organic optical device and insulative separator structures such that the electrical continuity between the top electrode layer covering the organic thin film transistors and that covering the pixels is broken by the presence of the insulative separator structures to electrically isolate the organic thin film transistors from the pixels on a top side of the active matrix organic optical device.

12. An active matrix organic optical device comprising: a plurality of thin film transistors and a plurality of organic optically active pixels on a common substrate wherein insulative separator structures are provided to electrically isolate the thin film transistors from the organic optically active pixels on a top side of the active matrix organic optical device and a top electrode layer is disposed over the entire active surface of the active matrix organic optical device and the insulative separator structures such that the electrical continuity between the top electrode layer covering the organic thin film transistors and that covering the pixels is broken by the presence of the insulative separator structures to electrically isolate the organic thin film transistors from the pixels on the top side of the active matrix organic optical device.

13. A method of forming an active matrix organic optical device comprising: depositing a plurality of thin film transistors and a plurality of organic optically active pixels on a common substrate wherein insulative separator structures are provided to electrically isolate the thin film transistors from the organic optically active pixels on a top side of the active matrix organic optical device and depositing a top electrode layer over the entire active surface of the active matrix organic optical device and the insulative separator structures such that the electrical continuity between the top electrode layer covering the organic thin film transistors and that covering the pixels is broken by the presence of the insulative separator structures to electrically isolate the organic thin film transistors from the pixels on the top side of the active matrix organic optical device.

14. An active matrix organic optical device according to claim 8, wherein the device further comprises a layer of insulating material over the thin film transistors.

15. A method according to claim 11, further comprising depositing a layer of insulating material over the thin film transistors prior to depositing the top electrode layer.

* * * * *

UNITED STATES PATENT AND TRADEMARK OFFICE
CERTIFICATE OF CORRECTION

| | | |
|---|---|---|
| PATENT NO. | : 8,013,328 B2 | Page 1 of 1 |
| APPLICATION NO. | : 12/529295 | |
| DATED | : September 6, 2011 | |
| INVENTOR(S) | : Jeremy Burroughes et al. | |

It is certified that error appears in the above-identified patent and that said Letters Patent is hereby corrected as shown below:

At Column 6, line 31, "re-labelled" should be -- relabeled --.

At Column 10, line 59, "Wherein" should be -- wherein --.

At Column 11, line 19, "comprising," should be -- comprising --.

Signed and Sealed this
Twenty-ninth Day of January, 2013

David J. Kappos
*Director of the United States Patent and Trademark Office*